(12) United States Patent
Govorkov

(10) Patent No.: US 6,219,368 B1
(45) Date of Patent: Apr. 17, 2001

(54) BEAM DELIVERY SYSTEM FOR MOLECULAR FLUORINE ($F_2$) LASER

(75) Inventor: Sergei V. Govorkov, Boca Raton, FL (US)

(73) Assignee: Lambda Physik GmbH, Goettingen (DE)

( * ) Notice: Subject to any disclaimer, the term of this patent is extended or adjusted under 35 U.S.C. 154(b) by 0 days.

(21) Appl. No.: 09/343,333

(22) Filed: Jun. 30, 1999

Related U.S. Application Data

(60) Provisional application No. 60/119,973, filed on Feb. 12, 1999.

(51) Int. Cl.[7] .................................................. H01S 3/22
(52) U.S. Cl. .............................................. 372/59; 372/57
(58) Field of Search ............................ 372/58, 59, 57

(56) References Cited

U.S. PATENT DOCUMENTS

| | | | |
|---|---|---|---|
| 4,616,908 | 10/1986 | King ..................................... | 350/576 |
| 5,051,558 | 9/1991 | Sukhman ........................ | 219/121.68 |
| 5,221,523 | 6/1993 | Usui ................................ | 219/121.78 |
| 5,440,578 | * 8/1995 | Sandstrom ............................. | 372/59 |
| 5,450,436 | * 9/1995 | Mizoguchi et al. ..................... | 372/59 |
| 5,559,584 | 9/1996 | Miyaji et al. ............................ | 355/73 |
| 5,590,146 | * 12/1996 | von Borstel ............................. | 372/59 |
| 5,763,855 | 6/1998 | Shioji ............................... | 219/121.84 |
| 5,811,753 | 9/1998 | Weick et al. ..................... | 219/121.78 |

FOREIGN PATENT DOCUMENTS 408055792   2/1996 (JP) ............................. H01L/21/027

OTHER PUBLICATIONS

H. Schmalenstroth et al., "Untersuchungen zum Laserstrahlschweissen mit 1–kW–Nd:YAG–Laser unter Einsatz verschiedener Schutzgasgemische," *Schweissen & Schneiden*, 49 (1997) Heft 7, pp. 420–424. (See translation starting on p. 3 of IDS).

J.A.R. Samson, "Techniques of Vacuum Ultraviolet Spectroscopy," John Wiley & Sons, New York.

*Applied Physics B Photo–physics and Laser Chemistry*, vol. B55, No. 1, Jul. 1992, "Influence of Cavity Configuration on the Pulse Energy of a High–Pressure Molecular Fluorine Laser," S.M. Hooker, A.M. Haxell, and C.E. Webb, 8 pp.

* cited by examiner

*Primary Examiner*—Leon Scott, Jr.
(74) *Attorney, Agent, or Firm*—Limbach & Limbach L.L.P.

(57) ABSTRACT

A method and apparatus are provided for delivering a laser beam from a laser, such as an $F_2$ laser, to a target through a sealed enclosure. The enclosure is evacuated and back-filled with an inert gas repeatedly for a number of times sufficient to adequately deplete any air, water, hydrocarbons or oxygen within the enclosure. Thereafter, an inert gas flow is established and maintained within the enclosure during operation of the laser. Propagation with significant transmittance of a sub-200 nm beam through the enclosure is particularly enabled.

44 Claims, 3 Drawing Sheets

BEAM DELIVERY SYSTEM FOR MOLECULAR FLUORINE (F$_2$) LASER

PRIORITY

This Application claims the benefit of U.S. Provisional Patent Application Ser. No. 60/119,973, filed Feb. 12, 1999.

BACKGROUND OF THE INVENTION

1. Field of the Invention

The present invention relates to a beam delivery system for use with lasers, and particularly for use with discharge pumped molecular fluorine lasers emitting around 157 nm.

2. Discussion of the Related Art

Molecular fluorine (F$_2$) lasers operating at a wavelength of approximately 157 nm are a likely choice for deep UV/vacuum UV microlithography with resolution below 0.1 micrometer. Laser radiation at this wavelength is also very useful for micromachining applications involving materials normally transparent at commonly available laser wavelengths.

Efficient extracavity transport of a sub-200 nm laser beam to the target is complicated by strong absorption in the atmosphere. That is, the sub-200 nm laser beam of such a laser will propagate a certain distance along an extracavity beam path between the laser output coupler and a work piece where it is subject to absorptive losses due to any photoabsorbing species such as water, oxygen and hydrocarbons located along the beam path. For example, an extinction length (1/e) for 157 nm radiation emitted by the F$_2$-laser is less than a millimeter in ambient air.

High intracavity losses also occur for lasers operating at wavelengths below 200 nm, again due particularly to characteristic absorption by oxygen and water, but also due to scattering in gases and all optical elements. As with the absorption, the short wavelength (less than 200 nm) is responsible for high scattering losses due to the wavelength dependence of the photon scattering cross section.

These complications from absorption and scattering are much less of a problem for conventional lithography systems employing 248 nm light, such as is emitted by the KrF-excimer laser. Species such as oxygen and water in the cavity and atmosphere which absorb strongly below 200 nm, and specifically very strongly around 157 nm for the F$_2$ laser, exhibit negligible absorption at 248 nm. The extinction length in ambient air for 248 nm light is substantially more than ten meters. Also, photon scattering in gases and optical elements is reduced at 248 nm compared with that occurring at shorter wavelengths. In addition, output beam characteristics are more sensitive to temperature-induced variations effecting the production of smaller structures lithographically at short wavelengths such as 157 nm, than those for longer wavelength lithography at 248 nm. Clearly, KrF excimer lasers do not have the same level of problems since the 248 nm light scatters less and experiences less absorption.

One possible solution for dealing with the absorption problems of the 157 nm emission of the F$_2$ laser is sealing the beam path with a housing or enclosure and purging the beam path with an inert gas. However, high flow rates are typically used in this technique in order to minimize the down time needed to remove absorbing species from the beam enclosure. That is, starting from a state where the enclosure is filled with ambient air, an unacceptably long purge time and high flow rate would be required to bring the partial pressure of absorbing species down to a reasonable level. It may also be necessary to perform this purging technique with a very clean inert gas, e.g., containing less than 1 ppm of absorbing species such as water and oxygen. Commercial ultra high purity (UHP) grade gases may be obtained to satisfy these purity requirements at increased cost. Overall, this purging approach is expensive and inconvenient.

Another solution would be evacuating the beam path. In this case, a relatively low pressure vacuum would be needed resulting in a complex and expensive system. For example, ultrahigh vacuum (UHV) equipment and techniques may be necessary for achieving a pressure below 100 millitorr. Such equipment and techniques combine a tight enclosure with high pumping capacity. Unsatisfactorily long initial pumping times would still be required. In this evacuation approach, transmission along the optical beam path enclosure would be determined by the absorption of radiation by "residual" gases, mainly oxygen, water vapor and hydrocarbons which remain despite the evacuation.

FIG. 1 shows an experimentally measured dependence of the transmission of a 0.5 meter optical path on the residual air pressure. A theoretical fit is also shown in FIG. 1 and is based on the assumption that the main absorbing species is water vapor having an absorption cross-section of approximately $3 \times 10^{-18}$ cm$^2$. This assumption is believed to be justified because water has a tendency to be adsorbed at the walls of vacuum systems and thus, to dominate the residual pressure in such systems.

As can be seen, at a residual pressure of 50 milliTorr, the optical losses amount to about 1% per each 0.5 meter of the optical path. At around 100 milliTorr, the optical losses amount to about 2% per each 0.5 meter. At 150 milliTorr and 200 milliTorr, respectively, the losses amount to 3% and 4.5%. In a system such as a microlithographic stepper, the optical beam path can be as large as several meters which would lead to an unsatisfactorily high total amount of losses at that loss rate. For example, an average five meter beam path, even at a transmittance between 99% and 95.5%, as shown for 50–200 milliTorr residual pressures in FIG. 1, corresponds to between a 10% and 37% loss.

It is clear from the above measurement and theoretical fit that one needs to lower the residual pressure of the absorbing species substantially below 100 milliTorr to achieve acceptable optical losses, e.g. less than around 1% per meter of optical path length. Such low pressures can only be obtained using complex and expensive vacuum equipment and/or operating the vacuum equipment for an unacceptably long time. All together, this leads to a substantial and undesirable downtime for pumping and requires complex and expensive equipment. An approach is needed for depleting the beam path of a laser operating below 200 nm, particularly an F$_2$ laser, of photoabsorbing species without incurring excessive down times or costs.

SUMMARY OF THE INVENTION

It is therefore an object of the invention to provide a laser system wherein a beam path of the laser is depleted of species which photoabsorb strongly below 200 nm including air, water, oxygen and hydrocarbons.

It is another object of the invention to provide the above laser with such a beam path without incurring long delays purging the beam path at high costs from significant losses of purging gases.

It is a further object of the invention to provide the above laser with such a beam path without using a complex vacuum system, such as with UHV equipment and techniques, also producing high cost and long initial pumping times.

The present invention overcomes the limitations of the alternative approaches suggested above by providing a method and apparatus using moderate vacuum capability in combination with purging with commonly available inert gases at a relatively low flow rate. Absorption losses achieved in this approach preferably do not exceed 1% per meter of optical path, and require a "warm up" time of only several minutes or less.

Specifically, the present invention meets the above objects by providing a method and apparatus for preparing a beam path of a laser, particularly a laser operating below 200 nm such as an $F_2$ laser. The beam path is first sealed from the outer atmosphere within a housing or enclosure. The enclosure is first evacuated and then back-filled with an inert gas repeatedly for a number of times sufficient to adequately deplete any air, water or oxygen within the enclosure. Thereafter, an inert gas flow is established and maintained within the enclosure during operation of the laser to keep the absorbing species out and maintain a homogeneous propagation path for the laser beam.

Propagation with significant transmittance of the 157 nm emission of a molecular fluorine ($F_2$) laser along the beam path is specifically enabled in the present invention, as well as for ArF, Xe, Kr, Ar, and $H_2$ lasers operating respectively at 193 nm, 172 nm, 145 nm, 125 nm and 121 nm. Neither long purging periods resulting in undesirably long down times, nor significant and costly gas losses are incurred, and ultra-high vacuum equipment and techniques are not needed.

DETAILED DESCRIPTION OF THE PREFERRED EMBODIMENT

Figure 1:
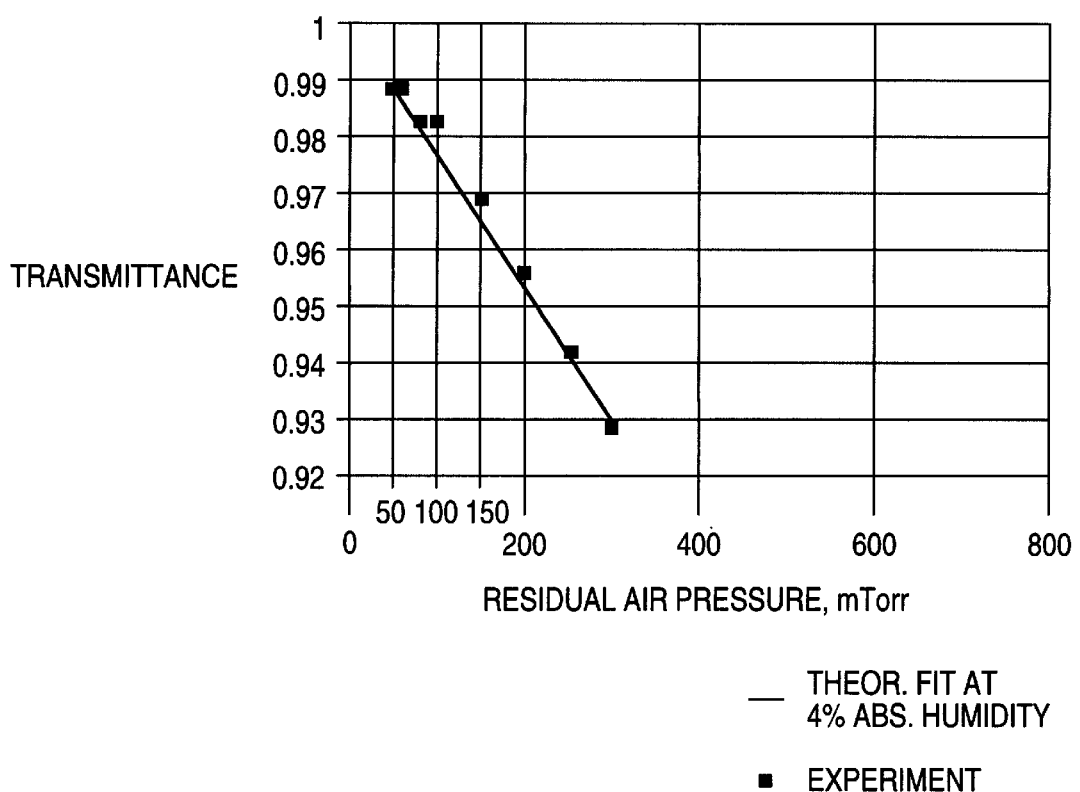
FIG. 1 shows a dependence of the transmittance of a 157 nm beam propagating along a 0.5 m evacuated beam path on the residual air pressure along the beam path.
Figure 2:
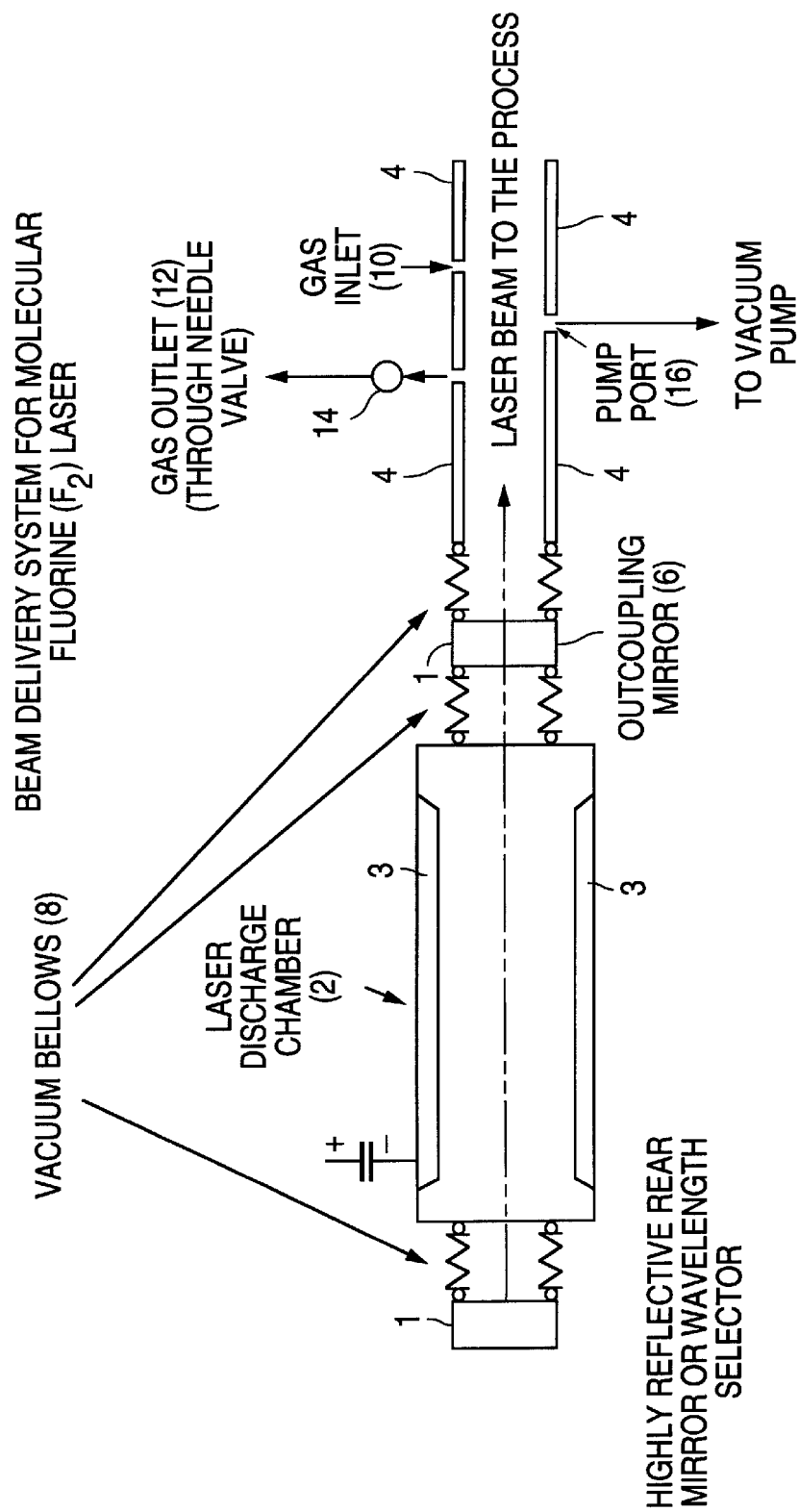
FIG. 2 shows a preferred embodiment of a beam delivery system for an $F_2$ laser emitting around 157 nm.

FIG. 2 shows a preferred embodiment of a beam delivery system for the present invention. The present invention may be used with any laser, but is particularly advantageous for a laser operating below 200 nm such as ArF, Xe, $F_2$, Kr, Ar and $H_2$ lasers operating around 193 nm, 172 nm, 157 nm, 145 nm, 125 nm and 121 nm, respectively. An $F_2$ laser system operating around 157 nm will be specifically referred to in the preferred embodiment below. Resonator optics 1 are preferably mounted to a laser discharge chamber 2 or tube in such a manner that their tilt can be adjusted, in order to align them to the optical axis of the resonator 1. Preferred optical and electrical systems are described in greater detail in U.S. patent application Ser. Nos. 09/090,989 and 09/136,353 and U.S. provisional application Ser. No. 60/120,218, each of which is hereby incorporated into the present application by reference. For example, means for selecting one of the closely-spaced natural emission lines around 157 nm of the $F_2$ laser is part of the preferred optics.

A pair of main electrodes 3 is connected to an external power supply circuit to supply a pulsed discharge to excite the molecular fluorine in the gas mixture. In addition, UV-preionization of the electrical discharge is also provided and may be realized by means of an array of spark gaps or by another source of UV-radiation (surface, barrier or corona gas discharges), disposed in the vicinity of at least one of the main electrodes 3 of the main discharge of the laser. A preferred preionization unit is described in U.S. patent application Ser. No. 09/247,887 which is also hereby incorporated by reference into this present application.

A housing or enclosure 4 containing the beam path is attached to an outcoupling mirror holder 6 of the resonator optics 1 preferably through vacuum bellows 8 and sealed with conventional o-rings (such as Viton™ o-rings), flat packing or other sealing materials. This allows degrees of freedom necessary for optical alignment of the outcoupling mirror 6, while at the same time maintaining a vacuum-quality seal between the outcoupler 6 and the beam path enclosure 4. The residual pressure within the beam path enclosure 4 preferably may be reduced to less than 200 milliTorr, and specifically to 100 milliTorr or less.

The enclosure 4 is equipped with a purging gas inlet 10 and a gas outlet 12 and means for controlling the gas flow rate, such as an adjustable needle valve 14. If only one inlet 10/outlet 12 pair is used, the inlet 10 and outlet 12 are spaced apart and preferably located at opposed ends of the enclosure 4. A long beam delivery system will preferably have several pairs of gas inlets 10 and outlets 12. The inlets 10 and outlets 12 are preferably positioned to provide a homogeneous medium within the enclosure along the beam path. In this way, every section of the beam delivery system is sufficiently purged with low consumption of the purge gas. Even a short beam delivery system may have several gas inlets 10 and outlets 12 especially, e.g., if a clear aperture within the beam delivery system is blocked by built-in optical components and mounts. For example, the beam path may be partitioned with one or more optical windows.

The preferred vacuum level can be achieved by connecting a simple and inexpensive (e.g., 50 mTorr) one or two stage mechanical rotary vane or rotary piston pump or roughing pump (not shown) to the enclosure 4 via a pump port 16. The pump port 16 need not be a separate connection to the enclosure 4. For example, the vacuum source may use the inlet 10 or outlet 12 connection to the enclosure 4 which may be sealed off from the pump when the inert gas is flowing, such as by a T-valve or some similar component.

Preferably, an oil vapor trap is used between the pump and the beam path enclosure, such as a cryogenic trap or Micromaze [™] filter. A three-stage diaphragm pump, which is relatively cheap and oil-free, can also be used. Alternatively, a more sophisticated pump or pumps may be used such as an oil diffusion pump, a cryogenic pump or a turbomolecular pump. The preferred "tightness" of the beam path enclosure 4 is equivalent to a leak rate of one Torr-liter per minute or lower. The purging gas is preferably ultra-high purity (UHP) grade helium, argon, or neon, although other inert gases (e.g., nitrogen) of UHP grade may also be used.

A preferred procedure of preparing the beam path enclosure 4 for operation of a laser system of the present invention, and particularly for the $F_2$ laser emitting at 157 nm, is explained below. Note that the preferred laser system includes a processor for controlling and coordinating various components. The procedure for preparing the beam path, in accord with the present invention, may be manually- or processor-controlled. If a processor is used, vacuum gauge and gas flow meter readings would be inputs. The processor would generate output signals for controlling the opening and closing of the pump port 16 and the purging gas inlet(s) 10 and outlet(s) 12 and the flow control of the valve 14.

The preferred method includes first, closing the gas inlet 10 and outlet 12. Second, opening the pump port 16, and pumping down the enclosure 4 with, e.g., a 50 milliTorr vacuum pump until the vacuum gauge indicates that a predetermined residual pressure has been reached within the enclosure 4, e.g., 200 milliTorr, and preferably 100 milliTorr, or lower. Next, the pump port 16 is closed off, the inlet port 10 is opened and the enclosure 4 is filled with inert gas flowing in through the inlet port 10 until approximately atmospheric pressure or higher is reached in the enclosure 4. Then, the inlet port 10 is again closed and the pump port 16 opened to repeat the evacuation procedure. These steps of evacuating the enclosure 4 followed by back-filling the enclosure 4 with inert gas are preferably repeated several times.

After these several gas flushing cycles, the pump port 16 is closed and both the gas inlet 10 and gas outlet 12 are opened. A gas flow at a selected flow rate, preferably around 0.1 liters per minute, is established and maintained in the enclosure 4 through control of the flow control valve 14. The pressure is now maintained around atmospheric pressure or preferably slightly higher. The beam path enclosure is now ready for working operation of the laser.

Figure 3:
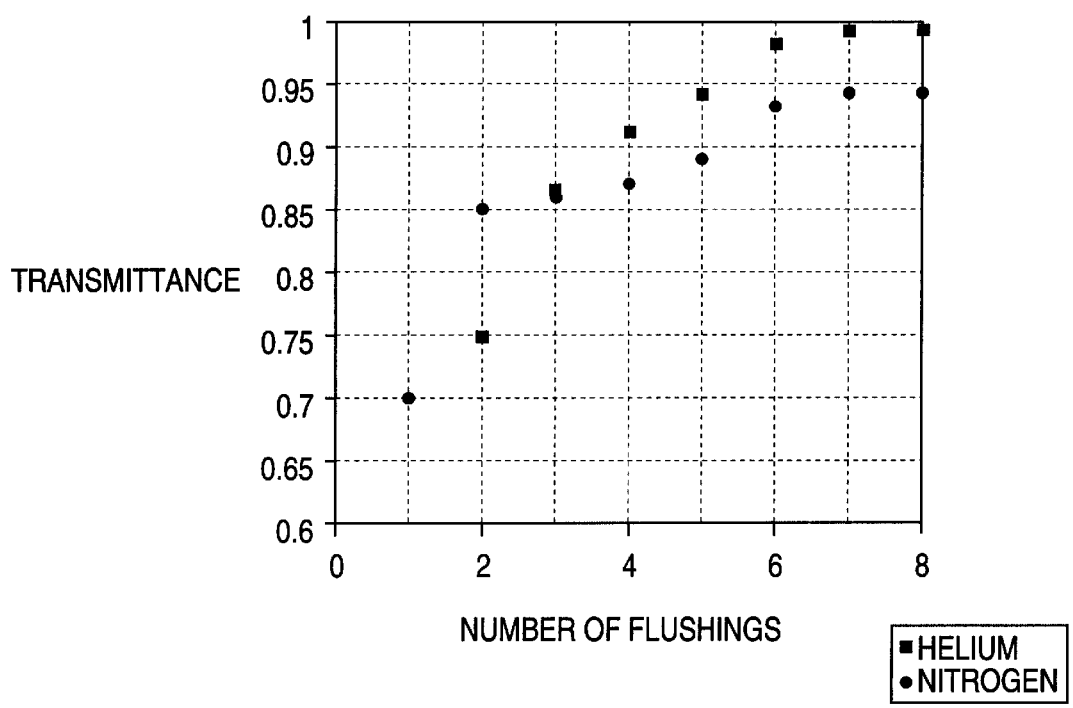
FIG. 3 shows a dependence of the transmittance of a 157 nm beam propagating along a 0.5 m beam path purged with helium or nitrogen gas on the number of flushings of the beam path using each of the two inert gases.

FIG. 3 shows that the transmittance of a 157 nm beam from an $F_2$ laser along a 0.5 meter long optical path using helium and nitrogen as flushing gases. The transmittance is shown as increasing with the number of flushes, but becomes asymptotic to its highest value in as few as eight (8) "flushing" cycles. Of course, more than eight flushing cycles may nonetheless be used. As can be seen, for helium, close to 99% transmittance can be achieved with eight flushes. The results using nitrogen were not as good as with helium. However, the nitrogen used in the experiments has a specified level of water of only 3 ppm, while UHP helium was much more pure and had a specified water level of less than 1 ppm which may have accounted for the difference in performance.

The present invention teaches that using cycles of evacuating and filling the enclosure 4 with inert gas allows drastically reduced preparation times and also minimizes inert gas consumption. After these flushing cycles are performed, a preferred flow rate of 0.1 liters per minute is sufficient to maintain high transmittance for a substantial period of time. The entire preparation cycle advantageously takes only a few minutes. In addition, relatively inexpensive pumps and lower cost sealing arrangements can be used.

The above description of the preferred embodiment is not meant to set forth the scope of the present invention. Instead, the scope of the present invention is that set forth in the claims that follow, and equivalents thereof.

What is claimed is:

1. A laser system for delivering a laser beam to a workpiece, comprising:
   a discharge chamber filled with a gas mixture;
   a pair of electrodes coupled with a power supply circuit for producing a pulsed discharge to energize the molecular fluorine;
   a resonator surrounding the discharge chamber for generating a laser beam; and
   an enclosure sealing at least a portion of the beam path exiting the laser from the outer atmosphere and having an evacuation port for connecting to a pump which reduces the pressure in the enclosure and removes photoabsorbing gaseous species from the enclosure for evacuating the enclosure and an inlet port and an outlet port for flowing an inert gas within said enclosure after evacuating said enclosure to enable the laser beam to propagate along said beam path, such that the energy of the beam can reach the workpiece without substantial attenuation due to the presence of photoabsorbing species along said beam path.

2. The system of claim 1, wherein said resonator comprises an outcoupler and at least one of a highly reflecting mirror and a wavelength selection device, wherein the entire beam path between said outcoupler and said at least one of a highly reflective mirror and a wavelength selection device is also sealed from the outer atmosphere.

3. A beam delivery system for connecting to a laser for delivering a laser beam to a workpiece, comprising:
   an enclosure sealing at least a portion of the beam path exiting the laser from the outer atmosphere;
   an evacuation port valve-connected to the enclosure and connected to a pump which reduces the pressure in the enclosure and removes photoabsorbing gaseous species from the enclosure for selectively evacuating the enclosure;
   an inlet port connected to an inert gas supply for flowing said inert gas within said enclosure after evacuating said enclosure; and
   an outlet port,
   whereby in use, the enclosure is evacuated and backfilled with the inert gas a number of times and thereafter a low level flow of inert gas is established within the enclosure to enhance transmission of laser energy therethrough.

4. The system of one of claims 1 or 3, wherein said low pressure source is a roughing pump which reduces the pressure in the enclosure and removes gaseous species from the enclosure.

5. The system of one of claims 1 or 3, further comprising one or more further inlet/outlet port pairs spaced along said enclosure to enhance the homogeneity of the gas flowing within said enclosure and thereby reducing concentration fluctuations of photoabsorbing gaseous species.

6. The system of one of claims 1 or 3, said evacuation port and said inlet port further for evacuating said enclosure and filling said enclosure with said inert gas repeatedly prior to flowing said inert gas within said enclosure.

7. A laser system, comprising:
   a discharge chamber filled with a gas mixture;
   a pair of electrodes coupled with a power supply circuit for producing a pulsed discharge;
   a resonator surrounding the discharge chamber for generating a laser beam;
   means for sealing a beam path of the laser system from the outer atmosphere;
   means for evacuating said beam path; and
   means for filling said beam path with an inert gas and flowing said inert gas along said beam path, to enable said laser beam to propagate along said beam path, such that the energy of the beam can reach a workpiece without substantial attenuation due to the presence of photoabsorbing species alone said beam path.

8. The system of any of claims 1–7, in which the laser beam is provided by a laser selected from the group of lasers consisting of an F2, ArF, Xe, Kr, Ar and H2 laser.

9. The system of any of claims 1–7, in which the laser beam is provided by an F2 laser.

10. The system of any of claims 1 or 3–7, wherein said inert gas is selected from the group of gases consisting of helium, argon, neon and nitrogen.

11. The system of any of claims 1 or 3–7, wherein the enclosure is evacuated to a pressure below 200 milliTorr.

12. The system of any of claims 1 or 3–7, wherein the enclosure is evacuated to a pressure below 100 milliTorr.

13. The system of any of claims 1 or 3–7, wherein the enclosure is evacuated to a pressure between 50 and 200 milliTor.

14. The system of any of claims 1 or 3–7, wherein the enclosure is evacuated to a pressure around 100 milliTorr.

15. The system of any of claims 1–7, wherein said enclosure is evacuated and filled more than once before establishing a continuous flow of said inert gas within said enclosure, to substantially remove photoabsorbing gaseous constituents from the enclosure.

16. The system of any of claims 1–7, wherein said enclosure is evacuated and filled more than three times before establishing a continuous flow of said inert gas within said enclosure, to substantially remove photoabsorbing gaseous constituents from the enclosure.

17. The system of any of claims 16, wherein said inert gas is flowed at a flow rate of less than 0.2 liters per minute.

18. The system of any of claims 1 or 3–7, wherein said enclosure is evacuated and filled more than six times before establishing a continuous flow of said inert gas within said enclosure.

19. The system of any of claims 1 or 3–7, wherein said inert gas is flowed at a flow rate of less than 0.2 liters per minute.

20. The system of any of claims 1 or 3–7, wherein said inert gas is flowed at a flow rate of less than approximately 0.1 liters per minute.

21. The system of any of claims 1 or 3–7, wherein said inert gas is flowed at a flow rate between 0.01 and 0.2 liters per minute.

22. The system of any of claims 1–7, wherein said inert gas has a purity of less than 3 ppm of contaminants including water, oxygen and hydrocarbons.

23. The system of any of claims 1–7, wherein said inert gas has a purity of less than 2 ppm of contaminants including water, oxygen and hydrocarbons.

24. The system of any of claims 1–7, wherein said inert gas has a purity of approximately 1 ppm of contaminants including water, oxygen and hydrocarbons.

25. A method of delivering laser light to a target through a sealed enclosure, comprising the steps of:

evacuating said enclosure;

filling said enclosure with an inert gas;

repeating said evacuating and filling steps a predetermined number of times; and establishing a flow of said inert gas within said enclosure, to reduce absorption of the laser light as it traverses the enclosure.

26. The method of claim 25, further comprising the step of selecting the inert gas from the group of inert gases consisting of argon, helium, neon and nitrogen.

27. The method of claim 25, further comprising the step of selecting a roughing pump for use in said evacuating step which reduces the pressure in the enclosure and removes gaseous species from the enclosure.

28. The method of claim 25, further comprising the step of selecting a laser from the group of lasers consisting of an F2, ArF. Xe, Kr, Ar and H2 laser to provide said laser light.

29. The method of claim 25, further comprising the step of selecting an $F_2$ laser to provide said laser light.

30. The method of claim 25, wherein said evacuating step includes the step of evacuating said enclosure to a pressure below 200 milliTorr.

31. The method of claim 25, wherein said evacuating step includes the step of evacuating said enclosure to a pressure below 100 milliTorr.

32. The method of claim 25, wherein said evacuating step includes the step of evacuating said enclosure to a pressure between 50 and 200 milliTorr.

33. The method of claim 25, wherein said evacuating step includes the step of evacuating said enclosure to a pressure around 100 milliTorr.

34. The method of claim 24, further comprising the step of selecting said predetermined number of times as more than three.

35. The method of claim 34, wherein said flow establishing step includes the step of selecting a flow rate of less than 0.2 liters per minute.

36. The method of claim 25, further comprising the step of selecting said predetermined number of times as more than six.

37. The method of claim 25, wherein said flow establishing step includes the step of selecting a flow rate of less than 0.5 liters per minute.

38. The method of claim 25, wherein said flow establishing step includes the step of selecting a flow rate of less than 0.2 liters per minute.

39. The method of claim 25, wherein said flow establishing step includes the step of selecting a flow rate of less than 0.1 liters per minute.

40. The method of claim 25, wherein said flow establishing step includes the step of selecting a flow rate between 0.01 and 0.2 liters per minute.

41. The method of claim 25, further comprising the step of selecting a purity of said inert gas of less than 3 ppm of contaminants including water, oxygen and hydrocarbons.

42. The method of claim 25, further comprising the step of selecting a purity of said inert gas of less than 2 ppm of contaminants including water, oxygen and hydrocarbons.

43. The method of claim 25, further comprising the step of selecting a purity of said inert gas of less than approximately 1 ppm of contaminants including water, oxygen and hydrocarbons.

44. The method of claim 25, further comprising the step of selecting a purity of said inert gas of approximately 1 ppm of contaminants including water, oxygen and hydrocarbons.

* * * * *